(12) United States Patent
Lu et al.

(10) Patent No.: US 8,413,014 B2
(45) Date of Patent: Apr. 2, 2013

(54) CYCLE SLIP DETECTION AND CORRECTION

(75) Inventors: Jin Lu, Lafayette, CO (US); Keith G. Boyer, Broomfield, CO (US)

(73) Assignee: Oracle America, Inc., Redwood City, CA (US)

( * ) Notice: Subject to any disclaimer, the term of this patent is extended or adjusted under 35 U.S.C. 154(b) by 916 days.

(21) Appl. No.: 12/511,664

(22) Filed: Jul. 29, 2009

(65) Prior Publication Data

US 2011/0029843 A1    Feb. 3, 2011

(51) Int. Cl.
*G11C 29/42* (2006.01)
*G11C 29/00* (2006.01)

(52) U.S. Cl. ........ 714/763; 714/758; 714/769; 714/771; 714/752; 360/26; 365/185.09; 369/30.21; 369/30.22

(58) Field of Classification Search .............. 714/763, 714/758, 771, 769; 365/185.09; 369/30.21, 369/30.22; 360/26
See application file for complete search history.

(56) References Cited

U.S. PATENT DOCUMENTS

| | | | | |
|---|---|---|---|---|
| 6,009,549 A * | 12/1999 | Bliss et al. | | 714/769 |
| 2005/0129147 A1 * | 6/2005 | Cannon et al. | | 375/324 |
| 2009/0019335 A1 * | 1/2009 | Boyer et al. | | 714/755 |
| 2010/0138722 A1 * | 6/2010 | Harley et al. | | 714/762 |
| 2010/0192038 A1 * | 7/2010 | Eroz et al. | | 714/752 |

OTHER PUBLICATIONS

Xiaowei Jin; Kavcic, A.; , "Cycle-slip-detector-aided iterative timing recovery," Magnetics, IEEE Transactions on , vol. 38, No. 5, pp. 2292-2294, Sep. 2002, doi: 10.1109/TMAG.2002.801869.*

* cited by examiner

*Primary Examiner* — Albert Decady
*Assistant Examiner* — Justin R Knapp
(74) *Attorney, Agent, or Firm* — Brooks Kushman P.C.

(57) ABSTRACT

A method of writing data to and reading data from a storage medium includes cycle slip detection and correction. An LDPC matrix includes a first area for cycle slip detection and correction. The first area satisfies a set of conditions such that a cycle slip at a particular position creates a pattern of parity check errors indicative of the position and polarity of the cycle slip. Writing user data to the storage medium includes encoding the user data with parity data according to the LDPC matrix. Reading the user data and the parity data from the storage medium includes decoding the user data and the parity data according to the LDPC matrix. Decoding includes, upon detecting a pattern of parity check errors indicative of the position and polarity of a detected cycle slip, correcting the detected cycle slip.

20 Claims, 7 Drawing Sheets

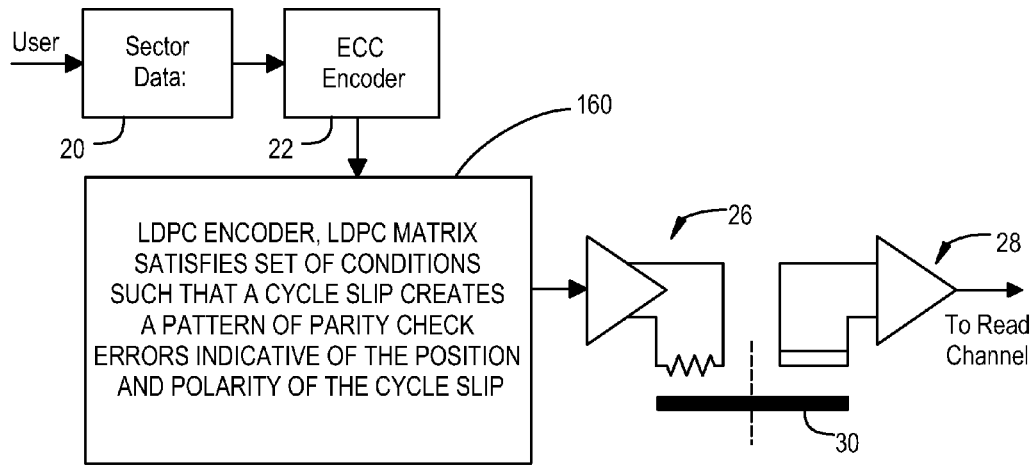
FIG. 9
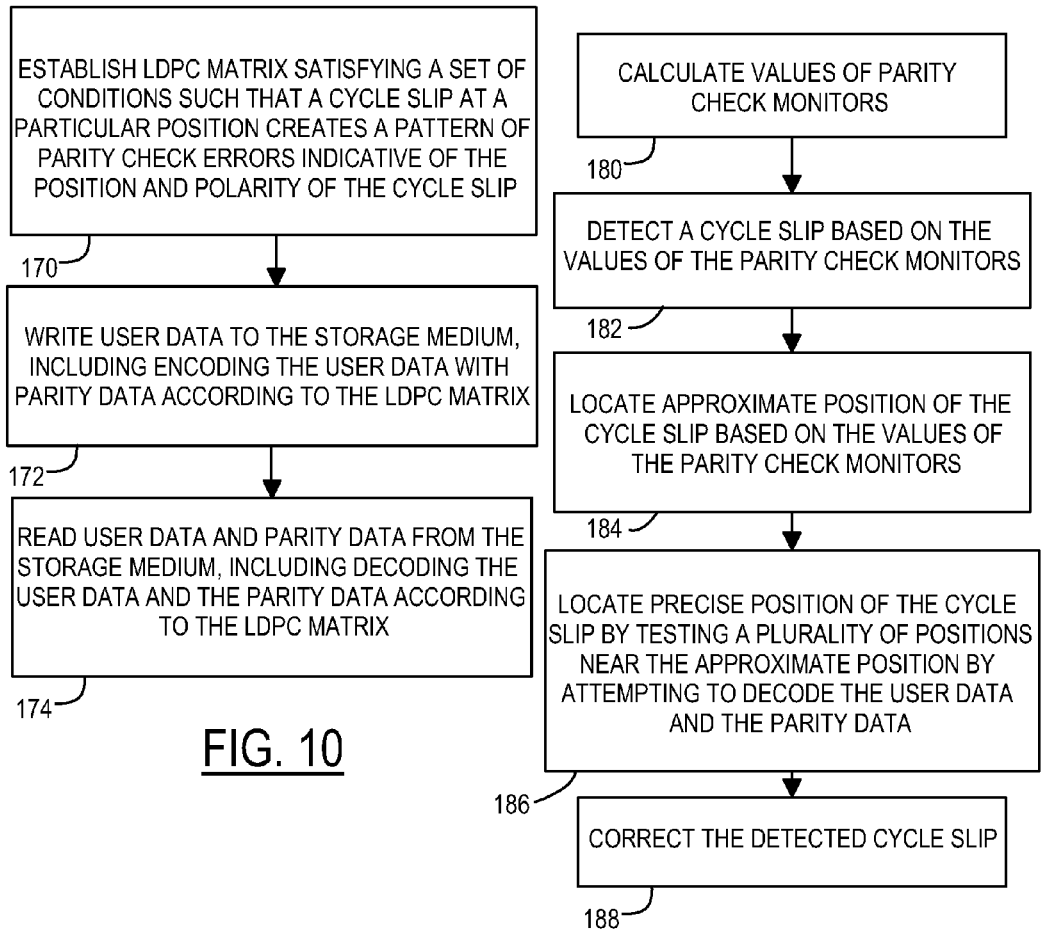
FIG. 10
FIG. 11

Matrix A

Matrix A'

Matrix B

Matrix B'

CYCLE SLIP DETECTION AND CORRECTION

BACKGROUND OF THE INVENTION

1. Field of the Invention

The invention relates to high recording density magnetic tape recording. The invention further relates to cycle slip detection and correction.

2. Background Art

When migrating into high recording density magnetic tape recording, cycle slips are considered to be a major limiting factor in the performance of the read/write channel as they cause long bursts of bit errors. Cycle slip is an event where the clock gets out of synchronization with the data, causing part or all of the bits in a data sector to be in error until the end of the data sector. FIG. 1 illustrates an original bit sequence at 10 and a detected bit sequence at 12 suffering from a cycle slip which occurs at 14. From FIG. 1, it is shown that all of the bits after a cycle slip are shifted one bit to the right in the detected bit sequence 12. Since all the bits after the occurrence of a cycle slip are in error, it is formidable to use error correction coding (ECC) to correctly recover the user data from cycle slips. Hence, it is crucial to design special methods to reduce the negative impacts of cycle slips.

Clearly, any signal interruption or failure of the PLL loop to correctly follow the incoming readback signal will cause cycle slips. Similarly, the failure to correctly detect and count an incoming waveform due to poor signal-to-noise ratio will also result in cycle slips. Further, dropouts can easily cause cycle slips because dropouts result in significant shifting of signal peak locations and this peak shift may generate cycle slips. Still further, the longitudinal vibration (tape path resonance) problem that exists in tape recording systems triggers very frequent cycle slips.

Cycle slip is a serious problem that prevents reliable read/write channel performance at high recording densities. The cycle slip problem can not be handled by the standard ECC.

FIG. 2 illustrates the major components in a tape write channel. As shown, sector data 20 is received from the user, passes through ECC encoder 22, passes through modulation encoder 24, and then is handled by the write hardware 26. The read hardware is indicated at 28, and passes read data to the read channel. The tape media is shown at 30.

FIG. 3 illustrates the major components in a tape read channel. As shown, variable gain amplifier 40 with automatic gain control 42 receives a signal from the pre-amplifier of the read hardware. The signal passes through asymmetry correction block 44, having automatic correction control 46, and through low pass filter 48, to sampler 50. The sampled data passes through equalizer 52 and then to Viterbi detector 54. Viterbi detector 54 detects the likely sequence of bits, and as appropriate, indicates to timing recovery block 56 that there is a timing problem with the detected signal. The bit sequence detected by the Viterbi detector 54 passes through modulation decoder 60 and ECC decoder 62 to result in the retrieved data.

Background information may be found in U.S. Pub. No. 2009/0019335.

For the foregoing reasons, there is a need to detect cycle slips and correct erroneous data sectors corrupted by cycle slips.

SUMMARY OF THE INVENTION

It is an object of the invention to provide an improved approach to cycle slip detection and correction.

In one embodiment of the invention, a method of writing data to and reading data from a storage medium includes cycle slip detection and correction. A low density parity check code (LDPC) matrix includes a first area for cycle slip detection and correction. The first area satisfies a set of conditions such that a cycle slip at a particular position creates a pattern of parity check errors indicative of the position and polarity of the cycle slip. Writing user data to the storage medium includes encoding the user data with parity data according to the LDPC matrix. Reading the user data and the parity data from the storage medium includes decoding the user data and the parity data according to the LDPC matrix. Decoding includes, upon detecting a pattern of parity check errors indicative of the position and polarity of a detected cycle slip, correcting the detected cycle slip.

It is appreciated that embodiments of the invention may be used for writing data to and reading data from a variety of different types of storage media. For example, the storage medium may be a high recording density magnetic tape.

It is appreciated that the set of conditions are such that a cycle slip at a particular position creates a pattern of parity check errors indicative of the position and polarity of the cycle slip. The set of conditions may vary depending on the application.

In an example embodiment of the invention, the first area of the LDPC matrix satisfies the following conditions:

$$x_1+x_2+x_3+\ldots+x_k=0$$

$$x_{k+1}+x_{k+2}+x_{k+3}+\ldots+x_{2k}=0$$

$$x_{2k+1}+x_{2k+2}+x_{2k+3}+\ldots+x_{3k}=0$$

$$\ldots$$

$$x_{(i-1)\cdot k+1}+x_{(i-1)\cdot k+2}+x_{(i-1)\cdot k+3}+\ldots+x_{i\cdot k}=0$$

$$\ldots$$

$$x_{(\alpha-1)\cdot k+1}+x_{(\alpha-1)\cdot k+2}+x_{(\alpha-1)\cdot k+3}+\ldots+x_{\alpha\cdot k}=0$$

wherein k is the average row weight of the first area of the LDPC matrix, and al is the number of columns of the LDPC matrix.

Other conditions that achieve the desired result are possible. In some implementations of the invention, the first area satisfies a plurality of conditions, with each condition relating to a corresponding sequence of neighboring columns of the LDPC matrix. It is also possible that each condition relates to a corresponding group of columns of the LDPC matrix. In some implementations, such as the specific example given above, each condition relates to the same number of columns of the LDPC matrix.

In the example embodiment, the LDPC matrix includes a second area, separate from the first area, for other data error detection and correction. In more detail, the invention comprehends a number of more detailed features. Embodiments of the invention may include one or more of the various additional features.

In the example embodiment, the set of conditions defines a plurality of parity check monitors, and decoding the user data and the parity data according to the LDPC matrix further comprises calculating the values of the plurality of parity check monitors. In more detail, the values of a first set of parity check monitors corresponding to the user data and the parity data in the absence of any shift are calculated. The values of a second set of parity check monitors corresponding to the user data and the parity data in the case of a left-shift are calculated. Further, the values of a third set of parity check monitors corresponding to the user data and the parity data in the case of a right-shift are calculated.

In another possibility, the values of a first set of parity check monitors corresponding to the user data and the parity data in the absence of any shift are calculated, and the values of a plurality of additional sets of parity check monitors are calculated. Each additional set of parity check monitors corresponds to the user data and the parity data in the case of a different shift. In this way, embodiments of the invention are not limited only to detecting single-bit left or right shifts, and various approaches to calculating parity check monitors may be taken to check for multiple-bit shifts, and to check for more than one shift in a given data set.

In one approach, a cycle slip is detected based on the values of the plurality of parity check monitors, and an approximate position of the cycle slip is located based on the values of the plurality of parity check monitors. Further, the precise position of the cycle slip is located by testing a plurality of positions near the approximate position of the cycle slip by attempting to decode the user data and the parity data according to the LDPC matrix.

It is also appreciated that embodiments of the invention may be implemented for reading data, writing data, or reading and writing data. Further, any such embodiments may incorporate any one or more of the various contemplated features.

For example, in another embodiment, the invention provides a method of reading data from a storage medium, including cycle slip detection and correction. The method comprises establishing a low density parity check code (LDPC) matrix for use in decoding data. The LDPC matrix includes a first area for cycle slip detection and correction. The first area satisfies a set of conditions such that a cycle slip at a particular position creates a pattern of parity check errors indicative of the position and polarity of the cycle slip. User data and parity data are read from the storage medium, and decoded according to the LDPC matrix. Decoding includes, upon detecting a pattern of parity check errors indicative of the position and polarity of a detected cycle slip, correcting the detected cycle slip.

In addition to methods of writing and reading data, the invention also comprehends a cycle slip detection and correction system for reading data from a storage medium. One embodiment comprises a storage hardware component configured to establish a low density parity check code (LDPC) matrix for use in decoding data. The LDPC matrix includes a first area for cycle slip detection and correction. The first area satisfies a set of conditions such that a cycle slip at a particular position creates a pattern of parity check errors indicative of the position and polarity of the cycle slip. The storage component is configured to read user data and parity data from the storage medium, including decoding the user data and the parity data according to the LDPC matrix. The storage component is further configured to, upon detecting a pattern of parity check errors indicative of the position and polarity of a detected cycle slip, correct the detected cycle slip.

BRIEF DESCRIPTION OF THE DRAWINGS

FIG. 9 illustrates the major components in a tape write channel in an embodiment of the invention;

FIG. 10 illustrates a method of writing data to and reading data from a storage medium in an embodiment of the invention;

FIG. 11 illustrates cycle slip detection and correction in an embodiment of the invention;

DETAILED DESCRIPTION OF THE PREFERRED EMBODIMENTS

In one embodiment of the invention, a method is provided that effectively detects a cycle slip, locates the exact starting point of the cycle slip, determines the polarity of the cycle slip, corrects the cycle slip, and successfully recovers the user data. The following description is for an example embodiment of the invention. Other implementations are possible.
Preprocessing: Design a Special Type of Low Density Parity Check Codes (LDPC)

Let k be the average row weight (number of "1" entries in a row) of the parity check matrix for LDPC codes. In order to detect cycle slips, LDPC codes are designed that satisfy the following conditions:

$$x_1+x_2+x_3+\ldots+x_k=0$$

$$x_{k+1}+x_{k+2}+x_{k+3}+\ldots+x_{2k}=0$$

$$x_{2k+1}+x_{2k+2}+x_{2k+3}+\ldots+x_{3k}=0$$

$$\ldots$$

$$x_{(i-1)\cdot k+1}+x_{(i-1)\cdot k+2}+x_{(i-1)\cdot k+3}+\ldots+x_{j\cdot k}=0$$

$$\ldots$$

$$x_{(\alpha-1)\cdot k+1}+x_{(\alpha-1)\cdot k+2}+x_{(\alpha-1)\cdot k+3}+\ldots+x_{\alpha\cdot k}=0$$

Figure 1:
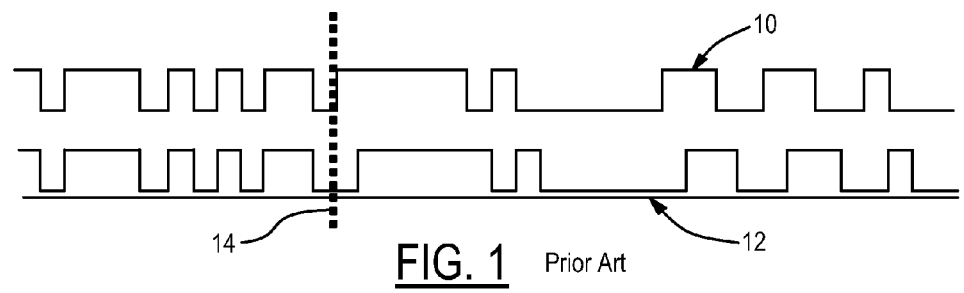
FIG. 1 illustrates an original bit sequence and a detected bit sequence suffering from cycle slip.
Figure 4:
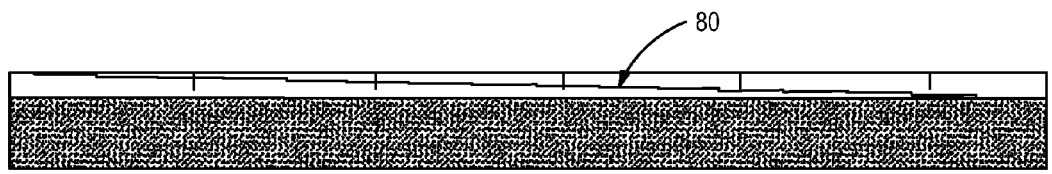
FIG. 4 illustrates a parity check matrix of an LDPC code used to detect and correct cycle slips.
Figure 2:
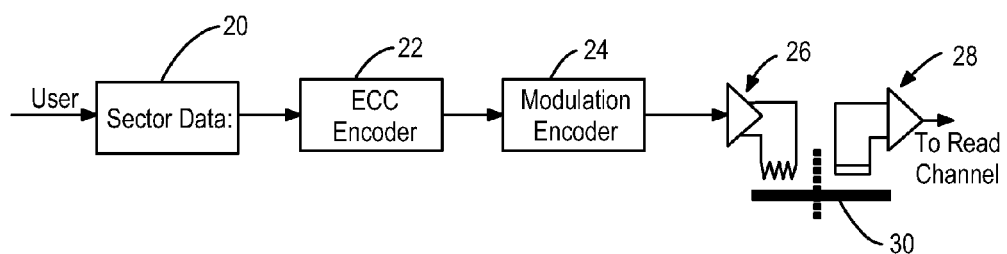
FIG. 2 illustrates the major components in a tape write channel.
Figure 3:
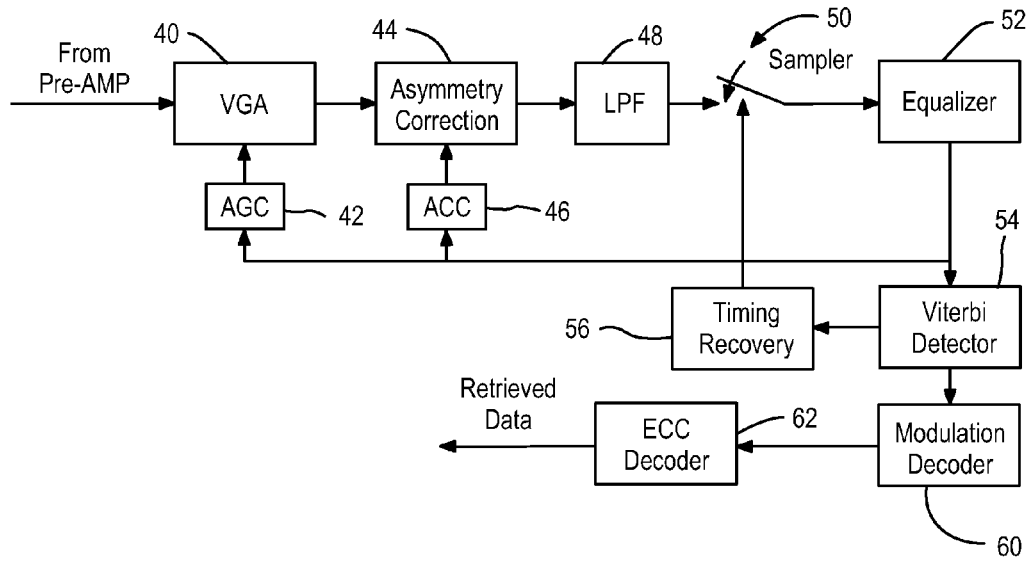
FIG. 3 illustrates the major components in a tape read channel.

The parity check matrix of an LDPC code that satisfies the above conditions is shown in FIG. 4. Note the segments, appearing generally in a first, upper area of the matrix, representing these conditions at 80. The second, lower and separate area of the matrix is for other data error correction and detection. The set of conditions may vary depending on the application. Other conditions that achieve the desired result are possible. In some implementations of the invention, the first area satisfies a plurality of conditions, with each condition relating to a corresponding sequence of neighboring columns of the LDPC matrix. It is also possible that each condition relates to a corresponding group of columns of the LDPC matrix. In some implementations, such as the specific example given above, each condition relates to the same number of columns of the LDPC matrix.

Cycle Slip Detection and Correction Method: the Four Key Steps

[Step 1] Compute the values of the parity check monitors from the received channel data:

Let $X=[x_1, x_2, x_3, \ldots, x_{\alpha \cdot k}]$ be the received bit sequence in a data sector in the read channel.

Compute the values of the following parity check monitors $M_1, M_2, \ldots, M_\alpha$.

$$M_1 = x_1 + x_2 + x_3 + \ldots + x_k$$

$$M_2 = x_{k+1} + x_{k+2} + x_{k+3} + \ldots + x_{2k}$$

$$M_3 = x_{2k+1} + x_{2k+2} + x_{2k+3} + \ldots + x_{3k}$$

$$\ldots$$

$$M_i = x_{(i-1) \cdot k+1} + x_{(i-1) \cdot k+2} + x_{(i-1) \cdot k+3} + \ldots + x_{i \cdot k}$$

$$\ldots$$

$$M_\alpha = x_{(\alpha-1) \cdot k+1} + x_{(\alpha-1) \cdot k+2} + x_{(\alpha-1) \cdot k+3} + \ldots + x_{\alpha \cdot k}$$

Next, construct two new bit sequences $X_L$ and $X_R$ from the received bit sequence X. $X_L$ is the one-bit left shift version of X while $X_R$ is the one-bit right shift version of X. Similarly, define and compute the corresponding parity check monitors $M_1^L, M_2^L, \ldots, M_\alpha^L$ for the new bit sequence $X_L$ and define and compute corresponding parity check monitors $M_1^R, M_2^R, \ldots, M_\alpha^R$ for the new bit sequence $X_R$.

[Step 2] Detect and locate the position of a cycle slip:

Based on the parity check monitors $M_1, M_2, \ldots, M_\alpha; M_1^L, M_2^L, \ldots, M_\alpha^L; M_1^R, M_2^R, \ldots, M_\alpha^R$ computed in [Step 1], further compute the following three sets of parameters: $S_1, S_2, S_3, \ldots, S_\alpha; S_1^L, S_2^L, S_3^L, \ldots, S_\alpha^L; S_1^R, S_2^R, S_3^R, \ldots, S_\alpha^R$.

$$S_1 = M_1 + M_2 + M_3 + \ldots + M_\alpha$$

$$S_2 = M_2 + M_3 + \ldots + M_\alpha$$

$$S_3 = M_3 + \ldots + M_\alpha$$

$$\ldots$$

$$S_{(\alpha-1)} = M_{(\alpha-1)} + M_\alpha$$

$$S_\alpha = M_\alpha$$

$$S_1^L = M_1^L + M_2^L + M_3^L + \ldots + M_\alpha^L$$

$$S_2^L = M_2^L + M_3^L + \ldots + M_\alpha^L$$

$$S_3^L = M_3^L + \ldots + M_\alpha^L$$

$$\ldots$$

$$S_{(\alpha-1)}^L = M_{(\alpha-1)}^L + M_\alpha^L$$

$$S_\alpha^L = M_\alpha^L$$

$$S_1^R = M_1^R + M_2^R + M_3^R + \ldots + M_\alpha^R$$

$$S_2^R = M_2^R + M_3^R + \ldots + M_\alpha^R$$

$$S_3^R = M_3^R + \ldots + M_\alpha^R$$

$$\ldots$$

$$S_{(\alpha-1)}^R = M_{(\alpha-1)}^R + M_\alpha^R$$

$$S_\alpha^R = M_\alpha^R$$

Figure 5A:
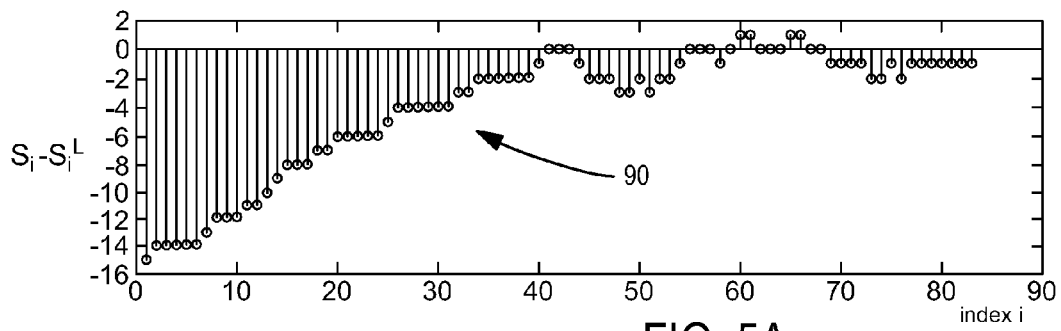
FIGS. 5A-5B depict a pair of plots used to detect and locate the position of a cycle slip, illustrating a pair of data sequences when the cycle slip is a right shift cycle slip.
Figure 5B:
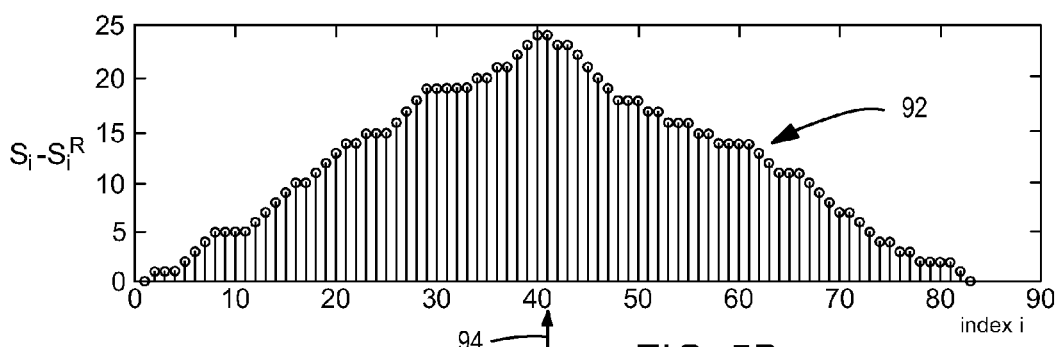
Figure 6A:
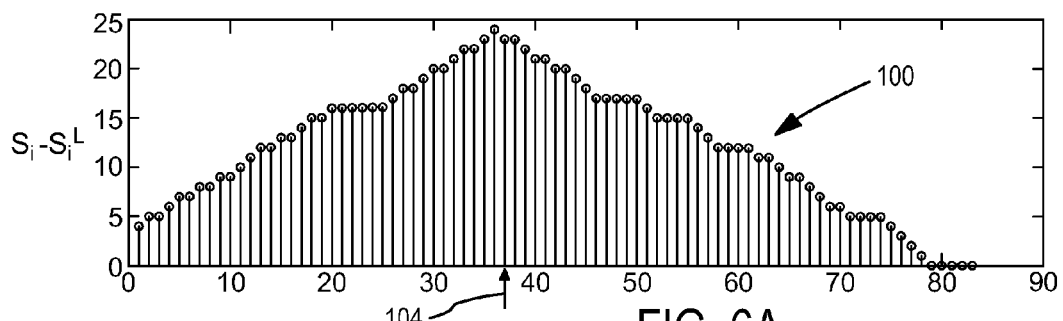
FIGS. 6A-6B depict a pair of plots used to detect and locate the position of a cycle slip, illustrating a pair of data sequences when the cycle slip is a left shift cycle slip.
Figure 6B:
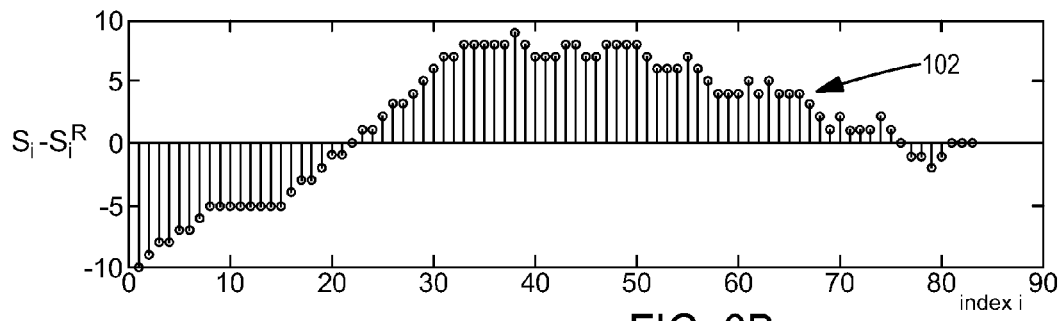
Figure 7A:
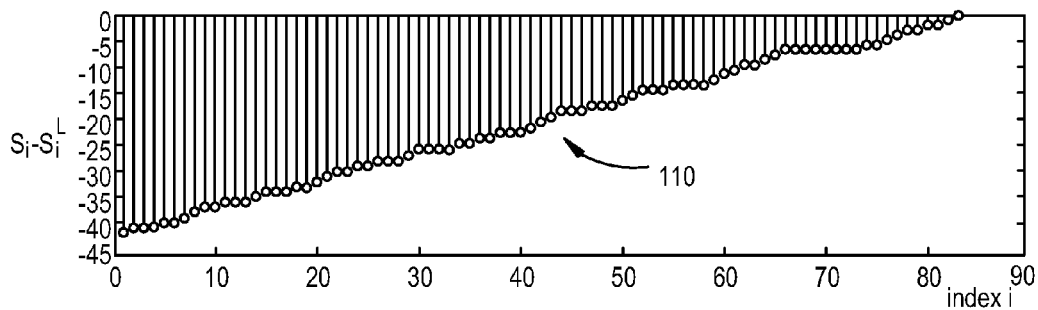
FIGS. 7A-7B depict a pair of plots used to detect and locate the position of a cycle slip, illustrating a pair of data sequences when no cycle slip occurs.
Figure 7B:
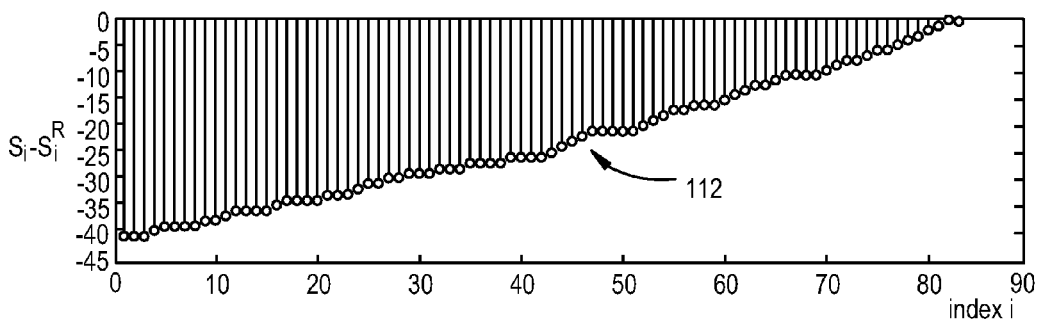

The characteristics of the data sequences $\{S_i - S_i^L\}_{1 \leq i \leq \alpha}$ and $\{S_i - S_i^R\}_{1 \leq i \leq \alpha}$ can clearly indicate whether a cycle slip occurs and where the cycle slip occurs. If a cycle slip occurs and it causes the data sector X to shift to the left, then the cycle slip occurs at the position where $\{S_i - S_i^L\}_{1 \leq i \leq \alpha}$ reaches its maximum value; if a cycle slip occurs and causes the data sector X to shift to the right, then the cycle slip occurs at the position where $\{S_i - S_i^R\}_{1 \leq i \leq \alpha}$ reaches its maximum value. If no cycle slip occurs, both $\{S_i - S_i^L\}_{1 \leq i \leq \alpha}$ and $\{S_i - S_i^R\}_{1 \leq i \leq \alpha}$ reach their maximum values only at the end of the bit sequences. For example, FIG. 5A plots $\{S_i - S_i^L\}_{1 \leq i \leq 83}$ at 90 and FIG. 5B plots $\{S_i - S_i^R\}_{1 \leq i \leq 83}$ at 92. Since at index i=40, the curve 92 for $\{S_i - S_i^R\}_{1 \leq i \leq 83}$ (FIG. 5B) reaches its maximum value (a high peak) at 94, the cycle slip is a right shift one and starts approximately at the position where the index i=40. Another example is shown in FIGS. 6A-6B. FIG. 6A plots $\{S_i - S_i^L\}_{1 \leq i \leq 83}$ at 100 and FIG. 6B plots $\{S_i - S_i^R\}_{1 \leq i \leq 83}$ at 102. Since at index i=36, the curve 100 for $\{S_i - S_i^L\}_{1 \leq i \leq 83}$ (FIG. 6A) reaches its maximum value (a high peak) at 104, the cycle slip is a left shift one and starts approximately at the position where the index i=36. FIGS. 7A-7B show the case that no cycle slip occurs. FIG. 7A plots $\{S_i - S_i^L\}_{1 \leq i \leq 83}$ at 110 and FIG. 7B plots $\{S_i - S_i^R\}_{1 \leq i \leq 83}$ at 112. Both $\{S_i - S_i^L\}_{1 \leq i \leq 83}$ and $\{S_i - S_i^R\}_{1 \leq i \leq 83}$ reach their maximums only at the end of the bit sequences. In other words, the two sequences do not have peaks in the middle.

The following rules are used to detect a cycle slip and determine the position and polarity (left shift or right shift) of the cycle slip.

Compute $\max(\{S_i - S_i^L\}_{1 \leq i \leq \alpha})$ and $\max(\{S_i - S_i^R\}_{1 \leq i \leq \alpha})$.

If the maximum values of $\{S_i - S_i^L\}_{1 \leq i \leq \alpha}$ and $\{S_i - S_i^R\}_{1 \leq i \leq \alpha}$ both appear at the index i=α, no cycle slip occurs.

Otherwise, if $\max(\{S_i - S_i^L\}_{1 \leq i \leq \alpha}) > \max(\{S_i - S_i^R\}_{1 \leq i \leq \alpha})$, a cycle slip occurs and the cycle slip is a left shift one; the cycle slip occurs at the position where $\{S_i - S_i^L\}_{1 \leq i \leq \alpha}$ achieves its maximum value;

if $\max(\{S_i - S_i^R\}_{1 \leq i \leq \alpha}) > \max(\{S_i - S_i^L\}_{1 \leq i \leq \alpha})$, a cycle slip occurs and the cycle slip is a right shift one; the cycle slip occurs at the position where $\{S_i - S_i^R\}_{1 \leq i \leq \alpha}$ achieves its maximum value.

[Step 3] Search for the Exact Starting Point of the Cycle Slip:

The previous step detects a cycle slip and estimates the approximate position of the cycle slip. In order to search for the exact position of the cycle slip, starting from the approximate location of the cycle slip, gradually test other close-by locations until finding the accurate position of the cycle slip. If the cycle slip is estimated to start at position d, test the position d first, then the positions d−Δ, d+Δ, d−2Δ, d+2Δ, d−3Δ, d+3Δ, ... subsequently where Δ is the search step size. Two LDPC decoding iterations may be used to test each position. Let $S_0$ denote the number of unsatisfied parity check equations before the LDPC decoding and let $S_2$ denote the number of unsatisfied parity check equations after two LDPC decoding iterations. If $S_2 \leq 0.667 \cdot S_0$ or the decoding success is achieved, the position tested is the accurate position of the cycle slip.

The proposed quick search method needs many LDPC decoding iterations. However, LDPC decoding is iterative and a large number of decoding iterations is not a significant burden for the LDPC decoder hardware.

[Step 4] Correct the Cycle Slip Using LDPC Decoding:

After finding the accurate position of a cycle slip, simply compensate for the bit shift caused by the cycle slip by doing the reverse bit shift. Next, use LDPC decoder to recover the original user data. The diagram of the described cycle slip detection and correction system is shown in FIG. 8.

Figure 8:
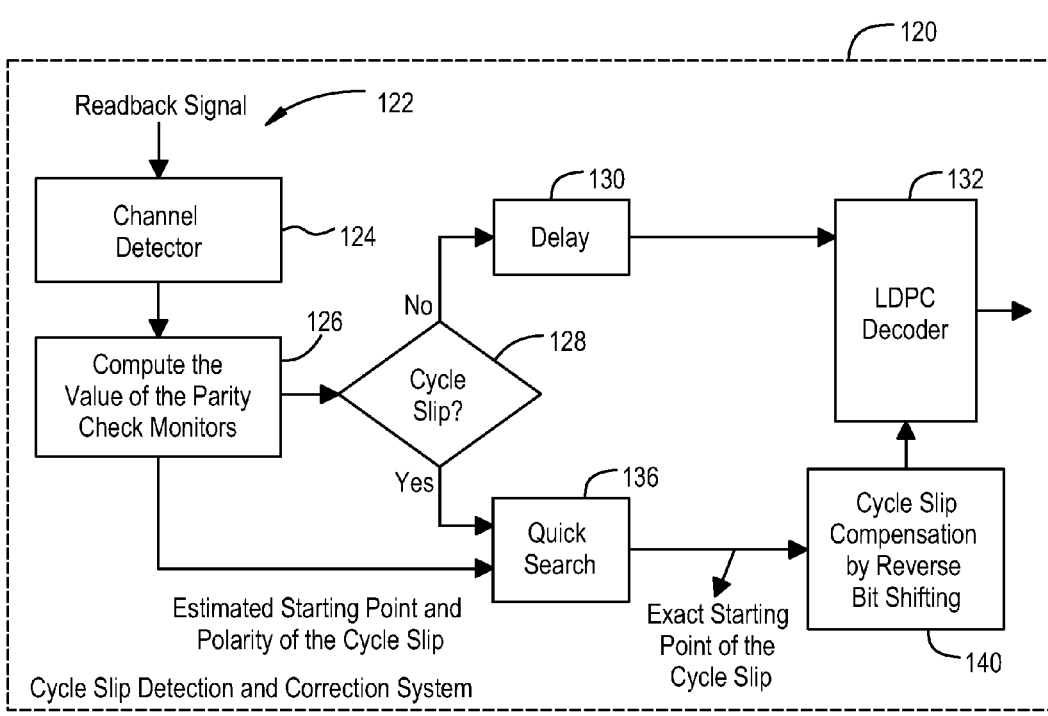
FIG. 8 is a diagram of an example cycle slip detection and correction system.

In FIG. 8, the cycle slip detection and correction system is indicated at 120. The readback signal is indicated at 122. In operation, the channel detector 124 detects the readback signal 122, and at block 126, the values of the parity check monitors are computed from the received channel data as described previously. At decision block 128, if no cycle slip occurs, flow proceeds to delay block 130, and then to LDPC decoder 132.

At decision block 128, if a cycle slip occurs, flow proceeds to quick search processing block 136. In more detail, the starting point and polarity of the cycle slip is estimated from the parity check monitors as described previously. At block 136, the system searches for the exact starting point of the cycle slip by starting from the approximate location of the cycle slip, gradually testing other close-by locations until finding the accurate location of the cycle slip as described previously. Thereafter, cycle slip compensation by reverse bit shifting takes place at block 140, and flow proceeds to LDPC decoder 132.

In summary, cycle slip is a major challenge that causes block errors in tape read/write channels. Embodiments of the invention may allow for quick and convenient detection and compensation of cycle slips and the successful recovery of the data sectors that are corrupted by cycle slips. Extensive simulations and experiments demonstrate that a proposed cycle slip correction method can correct up to 98.6% block errors caused by cycle slips. In addition to the high success rate of the cycle slip correction, the proposed method has the following advantages:

(1) It does not require extra coding overhead;
(2) It is straightforward to be implemented in hardware;
(3) It does not rely on phase, frequency, or other information from the timing recovery loop. The method is independent of the timing recovery loop. Therefore, its performance is not degraded by factors such as tape velocity change, friction between head and media, or media imperfection.

It is appreciated that the cycle slip correction system and method described above is an example implementation. Other implementations of the invention are possible. For example, other types of LDPC codes are possible, and the LDPC codes described herein are an example. The idea is that a cycle slip at a particular location creates a pattern of parity check errors indicative of the particular position and polarity of the cycle slip. That is, the position and polarity of the cycle slip may be determined from the data and the parity check errors, and may be corrected. In the example embodiment, LDPC codes that satisfy a specific set of conditions are described. In the example, a cycle slip creates a wave of parity check errors beginning at the cycle slip. Other LDPC codes that satisfy different conditions may be used in alternate implementations. Advantageously, embodiments of the invention provide detection and correction of cycle slips based on parity information, and do not need to rely on information from the timing recovery system.

FIG. 9 illustrates the major components in a tape write channel in an embodiment of the invention. As shown, sector data 20 is received from the user, passes through ECC encoder 22, passes through LDPC encoder 160, and then is handled by the write hardware 26. The read hardware is indicated at 28, and passes read data to the read channel. The tape media is shown at 30. LDPC encoder 160 utilizes an LDPC matrix for encoding data that includes a first area for cycle slip detection and correction. This first area satisfies a set of conditions such that a cycle slip at a particular position creates a pattern of parity check errors indicative of the position and polarity of the cycle slip.

FIG. 10 illustrates a method of writing data to and reading data from a storage medium in an embodiment of the invention. At block 170, an LDPC matrix is established. The established LDPC matrix includes a first area for cycle slip detection and correction. The first area satisfies a set of conditions such that a cycle slip at a particular position creates a pattern of parity check errors indicative of the position and polarity of the cycle slip. The set of conditions vary depending on the application. At block 172, user data is written to the storage medium, and the writing process includes encoding the user data with parity data according to the LDPC matrix. At block 174, the user data and the parity data are read from the storage medium. The reading process includes decoding the user data and the parity data according to the LDPC matrix.

FIG. 11 illustrates cycle slip detection and correction in an embodiment of the invention. In more detail, the decoding includes, upon detecting a pattern of parity check errors indicative of the position and polarity of a detected cycle slip, correcting the detected cycle slip. At block 180, the values of the parity check monitors are calculated. At block 182, a cycle slip may be detected based on the values of the parity check monitors. And, at block 184, the approximate position of the cycle slip is located based on the values of the parity check monitors.

Blocks 180, 182, and 184 may be implemented in various ways, depending on the application. For example, the values of a first set of parity check monitors corresponding to the user data and the parity data in the absence of any shift are calculated. The values of a second set of parity check monitors corresponding to the user data and the parity data in the case of a left-shift are calculated. Further, the values of a third set of parity check monitors corresponding to the user data and the parity data in the case of a right-shift are calculated. In another example, the values of a first set of parity check monitors corresponding to the user data and the parity data in the absence of any shift are calculated, and the values of a plurality of additional sets of parity check monitors are calculated. Each additional set of parity check monitors corresponds to the user data and the parity data in the case of a different shift. In this way, embodiments of the invention are not limited only to detecting single-bit left or right shifts, and various approaches to calculating parity check monitors may be taken to check for multiple-bit shifts, and to check for more than one shift in a given data set.

In one approach, at block 186, the precise position of the cycle slip is located by testing a plurality of positions near the approximate position of the cycle slip by attempting to decode the user data and the parity data according to the LDPC matrix. At block 188, the detected cycle slip is corrected.

As discussed previously, embodiments of the invention may be implemented in ways that detect a cycle slip that causes multi-bit shifts instead of single bit shifts. As well, embodiments of the invention may be implemented so as to detect multiple cycle slips occurring in the same data sector. An example of these features is described below.

Let X be the bit sequence in a received data sector. Compute the values of the parity check monitors $M_1, M_2, \ldots, M_\alpha$ from X. Further, construct new bit sequences $X_{L1}, X_{L2}, \ldots$ from X such that $X_{L1}$ is the 1-bit left shift version of X, $X_{L2}$ is the 2-bit left shift version of X, and so on. Similarly, construct new bit sequences $X_{R1}, X_{R2}, \ldots$ from X such that $X_{R1}$ is the 1-bit right shift version of X, $X_{R2}$ is the 2-bit right shift version of X, and so on. Furthermore, compute the corresponding parity check monitors $M_1^{L1}, M_2^{L1}; \ldots; M_\alpha^{L1}$ from the bit sequence $X_{L1}$; compute the corresponding parity check monitors $M_1^{L2}, M_2^{L2}, \ldots, M_\alpha^{L2}$ from the bit sequence $X_{L2}$; compute the corresponding parity check monitors $M_1^{R1}, M_2^{R1}; \ldots; M_\alpha^{R1}$ from the bit sequence $X_{R1}$; and compute the corresponding parity check monitors $M_1^{R2}, M_2^{R2}, \ldots, M_\alpha^{R2}$ from the bit sequence $X_{R2}$. In an example limited to 2-bit shifts, based on the computed parity check monitors $M_1, M_2, \ldots, M_\alpha^{R2}$, further compute the following parameters: $S_1, S_2, S_3, \ldots, S_\alpha; S_1^{L1}, S_2^{L1}, S_3^{L1}, \ldots, S_\alpha^{L1}; S_1^{L2}, S_2^{L2}, S_3^{L2}, \ldots, S_\alpha^{L2}; S_1^{R1}, S_2^{R1}, S_3^{R1}, \ldots, S_\alpha^{R1}; S_1^{R2}, S_2^{R2}, S_3^{R2}, \ldots, S_\alpha^{R2}$ as follows.

$$S_1 = M_1 + M_2 + M_3 + \ldots + M_\alpha$$

$$S_2 = M_2 + M_3 + \ldots + M_\alpha$$

$$S_3 = M_3 + \ldots + M_\alpha$$

$$\ldots$$

$$S_{(\alpha-1)} = M_{(\alpha-1)} + M_\alpha$$

$$S_\alpha = M_\alpha$$

$$S_1^{L1} = M_1^{L1} + M_2^{L1} + M_3^{L1} + \ldots + M_\alpha^{L1}$$

$$S_2^{L1} = M_2^{L1} + M_3^{L1} + \ldots + M_\alpha^{L1}$$

$$S_3^{L1} = M_3^{L1} + \ldots + M_\alpha^{L1}$$

$$\ldots$$

$$S_{(\alpha-1)}^{L1} = M_{(\alpha-1)}^{L1} + M_\alpha^{L1}$$

$$S_\alpha^{L1} = M_\alpha^{L1}$$

$$S_1^{R1} = M_1^{R1} + M_2^{R1} + M_3^{R1} + \ldots + M_\alpha^{R1}$$

$$S_2^{R1} = M_2^{R1} + M_3^{R1} + \ldots + M_\alpha^{R1}$$

$$S_3^{R1} = M_3^{R1} + \ldots + M_\alpha^{R1}$$

$$\ldots$$

$$S_{(\alpha-1)}^{R1} = M_{(\alpha-1)}^{R1} + M_\alpha^{R1}$$

$$S_\alpha^{R1} = M_\alpha^{R1}$$

$$S_1^{L2} = M_1^{L2} + M_2^{L2} + M_3^{L2} + \ldots + M_\alpha^{L2}$$

$$S_2^{L2} = M_2^{L2} + M_3^{L2} + \ldots + M_\alpha^{L2}$$

$$S_3^{L2} = M_3^{L2} + \ldots + M_\alpha^{L2}$$

$$\ldots$$

$$S_{(\alpha-1)}^{L2} = M_{(\alpha-1)}^{L2} + M_\alpha^{L2}$$

$$S_\alpha^{L2} = M_\alpha^{L2}$$

$$S_1^{R2} = M_1^{R2} + M_2^{R2} + M_3^{R2} + \ldots + M_\alpha^{R2}$$

$$S_2^{R2} = M_2^{R2} + M_3^{R2} + \ldots + M_\alpha^{R2}$$

$$S_3^{R2} = M_3^{R2} + \ldots + M_\alpha^{R2}$$

$$\ldots$$

$$S_{(\alpha-1)}^{R2} = M_{(\alpha-1)}^{R2} + M_{(\alpha-1)}^{R2}$$

$$S_\alpha^{R2} = M_\alpha^{R2}$$

If a cycle slip causes the data sector X to shift 2 bits to the left, then the cycle slip occurs at the position where the sequence $\{S_i - S_i^{L2}\}_{1 \leq i \leq \alpha}$ reaches its maximum value.

If a cycle slip causes the data sector X to shift 2 bits to the right, then the cycle slip occurs at the position where the sequence $\{S_i - S_i^{R2}\}_{1 \leq i \leq \alpha}$ reaches its maximum value.

It is appreciated that the above described approach can be extended to cover multiple bit shifts of greater than 2 bits.

Figure 12A:
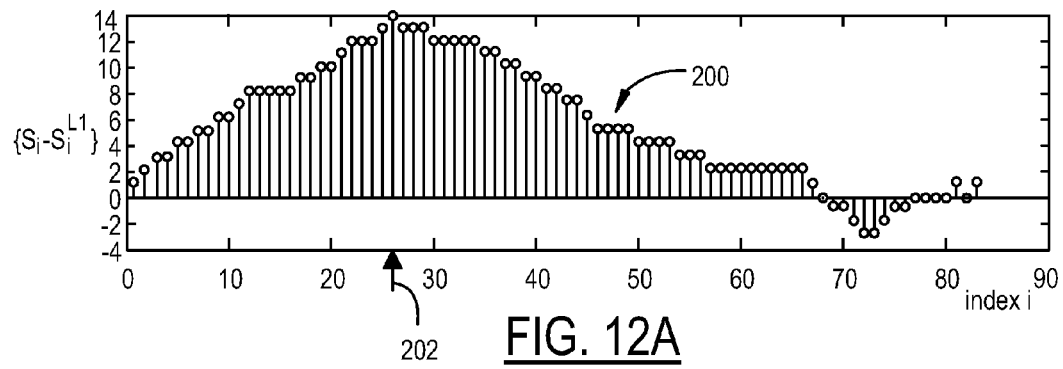
FIGS. 12A-12B depict a pair of plots used to detect and locate two cycle slips occurring in the same data sector, illustrating a pair of data sequences when the first cycle slip is a left shift cycle slip and the second cycle slip is also a left shift cycle slip.
Figure 12B:
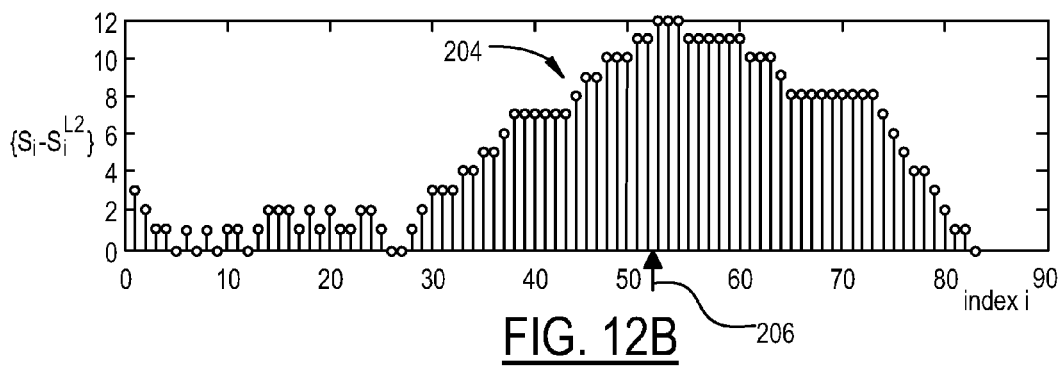

If $\{S_i - S_i^{L1}\}_{1 \leq i \leq \alpha}$ achieves its maximum value at the location $d_1$, and $\{S_i^{L1} - S_i^{L2}\}_{1 \leq i \leq \alpha}$ eject achieves its maximum value at the location $d_2$ ($d_2 > d_1$), then two cycle slips occurred in a single data sector. The first cycle slip is a left-shift one, occurring at the location $d_1$. The second cycle slip is still a left-shift one, occurring at the location $d_2$. For example, as shown in FIGS. 12A-12B, the sequence $\{S_1 - S_i^{L1}\}_{1 \leq i \leq 83}$ at 200 reaches its peak value at 202 at the index $d_1 = 26$ and the sequence $\{S_1^{L1} - S_1^{L2}\}_{1 \leq i \leq 83}$ at 204 reaches its peak value at 206 at the index $d_2 = 52$. Therefore, two cycle slips occurred in the same data sector. The first cycle slip occurred around the index $d_1 = 26$. The second cycle slip occurred around the index $d_2 = 52$.

Figure 13A:
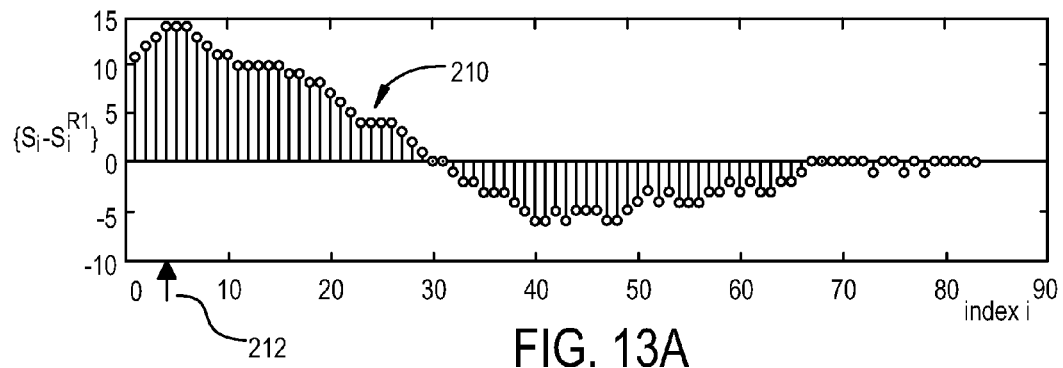
FIGS. 13A-13B depict a pair of plots used to detect and locate two cycle slips occurring in the same data sector, illustrating a pair of data sequences when the first cycle slip is a right shift cycle slip and the second cycle slip is also a right shift cycle slip.
Figure 13B:
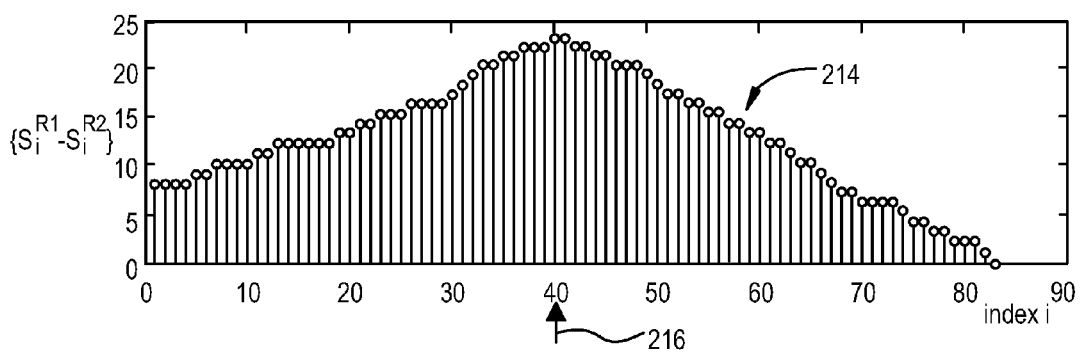

Similarly, if $\{S_i - S_i^{R1}\}_{1 \leq i \leq \alpha}$ achieves its maximum value at the location $d_1$, and $\{S_i^{R1} - S_i^{R2}\}_{1 \leq i \leq \alpha}$ achieves its maximum value at the location $d_2$ ($d_2 > d_1$), then two cycle slips occurred in a single data sector. The first cycle slip is a right-shift one, occurring at the location $d_1$. The second cycle slip is still a right-shift one, occurring at the location $d_2$. For example, as shown in FIGS. 13A-13B, the sequence $\{S_1^{R1} - S_i^{R2}\}_{1 \leq i \leq 83}$ at 210 reaches its peak value at 212 at the index $d_1 = 4$ and the sequence $\{S_i^{R1} - S_i^{R2}\}_{1 \leq i \leq 83}$ at 214 reaches its peak value at 216 at the index $d_2 = 40$. Therefore, two cycle slips occurred in the same data sector. The first cycle slip occurred around the index $d_1 = 4$. The second cycle slip occurred around the index $d_2 = 40$.

In addition, if $\{S_i - S_i^{L1}\}_{1 \leq i \leq \alpha}$ achieves its maximum value at the location $d_1$, and $\{S_i^{L1} - S_i\}_{1 \leq i \leq \alpha}$ achieves its maximum value at the location $d_2$ ($d_2 > d_1$), then two cycle slips occurred in a single data sector. The first cycle slip is a left-shift one, occurring at the location $d_1$. The second cycle slip is a right-shift one, occurring at the location $d_2$.

Further, if $\{S_i - S_i^{R1}\}_{1 \leq i \leq \alpha}$ achieves its maximum value at the location $d_1$, and $\{S_i^{R1} - S_i\}_{1 \leq i \leq \alpha}$ achieves its maximum value at the location $d_2$ ($d_2 > d_1$), then two cycle slips occurred in a single data sector. The first cycle slip is a right-shift one, occurring at the location $d_1$. The second cycle slip is a left-shift one, occurring at the location $d_2$.

It is appreciated that the above rules to detect two cycle slips occurring in the same data sector can be further extended to detect more than two cycle slips occurring in the same data sector.

Embodiments of the invention may implement the LDPC matrix in a variety of ways such that the data and parity information allow cycle slip detection, and the cycle slip detection may be extended to cover multiple bit cycle slips and multiple cycle slips in the same data sector, as apparent from the description and examples above.

Figure 14:
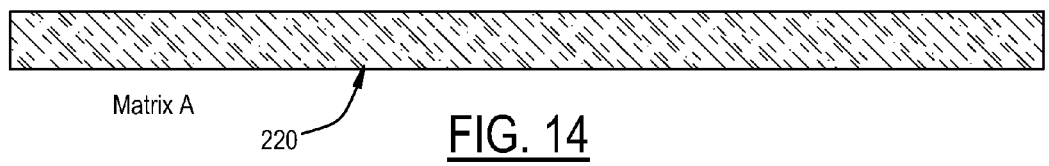
FIG. 14 illustrates a parity check matrix A of a structured LDPC code.
Figure 15:
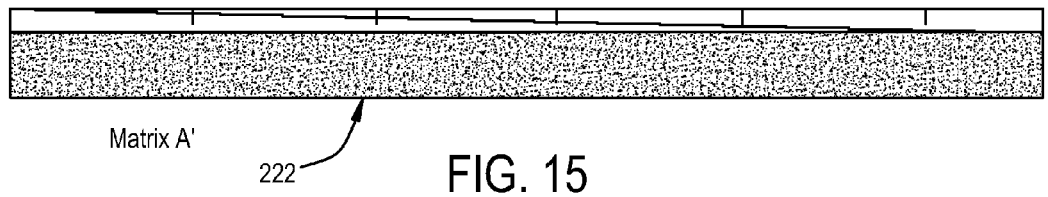
FIG. 15 illustrates a parity check matrix A' equivalently transformed from the matrix A of FIG. 14.

Further, the description and examples above refer to the LDPC matrix including a first area for cycle slip detection and correction, the first area satisfying a set of conditions such that a cycle slip at a particular position creates a pattern of parity check errors indicative of the position and polarity of the cycle slip. In fact, the first area of the LDPC matrix also has the power of error correction in addition to the functions of cycle slip detection and correction. FIG. 14 illustrates matrix A at 220. FIG. 15 illustrates matrix A' at 222. As shown in FIG. 15, the first area of the matrix A' satisfies a set of conditions such that a cycle slip at a particular position creates a pattern of parity check errors indicative of the position and polarity of the cycle slip. However, the matrix A' is equivalently transformed from the parity check matrix A (FIG. 14) of a structured (a type of LDPC codes whose matrix representations have inner structures) LDPC code by matrix permutation. Therefore, the LDPC matrix A' is equivalent to the LDPC matrix A in terms of error correction capability. In other words, forcing the first area of a LDPC matrix to satisfy the conditions to detect and correct cycle slips does not impair or have to sacrifice the error-correction ability of LDPC codes. Embodiments of the invention have the convenience of detecting cycle slips (having matrix A') while at the same time maintain LDPC codes' power (A' is as powerful as A) to correct bit errors from noise, distortions, and dropouts.

Figure 16:
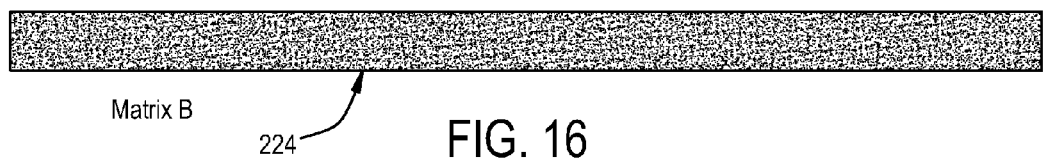
FIG. 16 illustrates a parity check matrix B of a random LDPC code.
Figure 17:
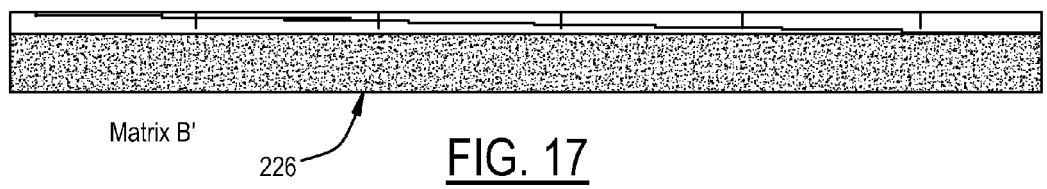
FIG. 17 illustrates a parity check matrix B' equivalently transformed from the matrix B of FIG. 16.

Similarly, FIG. 16 illustrates matrix B at 224. FIG. 17 illustrates matrix B' at 226. As shown in FIG. 17, the first area of the matrix B' satisfies a set of conditions to detect a cycle slip. Matrix B' is transformed from the parity check matrix B (FIG. 16) of a random (another type of LDPC codes whose matrix representations are totally randomly constructed) LDPC code. Therefore, the error correction capability of matrix B' is equivalent to that of the general random LDPC matrix B.

Further, it is concluded that any LDPC matrix that has exactly one entry "1" in each column in its first area can be transformed into an LDPC matrix satisfying a set of conditions to detect and locate a cycle slip by matrix permutation.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of writing data to and reading data from a storage medium, including cycle slip detection and correction, the method comprising:
    establishing a low density parity check code (LDPC) matrix for use in encoding and decoding data, the LDPC matrix including a first area for cycle slip detection and correction, the first area satisfying a set of conditions such that a cycle slip at a particular position creates a pattern of parity check errors indicative of the position and polarity of the cycle slip;
    writing user data to the storage medium, including encoding the user data with parity data according to the LDPC matrix;
    reading the user data and the parity data from the storage medium, including decoding the user data and the parity data according to the LDPC matrix; and
    wherein decoding includes, upon detecting a pattern of parity check errors indicative of the position and polarity of a detected cycle slip, correcting the detected cycle slip.

2. The method of claim 1 wherein the storage medium is a high recording density magnetic tape.

3. The method of claim 1 wherein the first area satisfies the following conditions:

$$x_1+x_2+x_3+\ldots+x_k=0$$

$$x_{k+1}+x_{k+2}+x_{k+3}+\ldots+x_{2k}=0$$

$$x_{2k+1}+x_{2k+2}+x_{2k+3}+\ldots+x_{3k}=0$$

$$\ldots$$

$$x_{(i-1)\cdot k+1}+x_{(i-1)\cdot k+2}+x_{(i-1)\cdot k+3}+\ldots+x_{i\cdot k}=0$$

$$\ldots$$

$$x_{(\alpha-1)\cdot k+1}+x_{(\alpha-1)\cdot k+2}+x_{(\alpha-1)\cdot k+3}+\ldots+x_{\alpha\cdot k}=0$$

wherein k is the average row weight of the first area of the LDPC matrix, and $\alpha\cdot k$ is the number of columns of the LDPC matrix.

4. The method of claim 1 wherein the first area satisfies a plurality of conditions, each condition relating to a corresponding sequence of neighboring columns of the LDPC matrix.

5. The method of claim 1 wherein the first area satisfies a plurality of conditions, each condition relating to a corresponding group of columns of the LDPC matrix.

6. The method of claim 1 wherein the first area satisfies a plurality of conditions, each condition relating to the same number of columns of the LDPC matrix.

7. The method of claim 1 wherein the LDPC matrix includes a second area, separate from the first area, for other data error detection and correction.

8. The method of claim 1 wherein the set of conditions defines a plurality of parity check monitors, and wherein decoding the user data and the parity data according to the LDPC matrix further comprises:
    calculating the values of the plurality of parity check monitors.

9. The method of claim 8 further comprising:
    calculating the values of a first set of parity check monitors corresponding to the user data and the parity data in the absence of any shift;
    calculating the values of a second set of parity check monitors corresponding to the user data and the parity data in the case of a left-shift; and
    calculating the values of a third set of parity check monitors corresponding to the user data and the parity data in the case of a right-shift.

10. The method of claim 8 further comprising:
    calculating the values of a first set of parity check monitors corresponding to the user data and the parity data in the absence of any shift; and
    calculating the values of a plurality of additional sets of parity check monitors, each additional set of parity check monitors corresponding to the user data and the parity data in the case of a different shift.

11. The method of claim 8 further comprising:
    detecting a cycle slip based on the values of the plurality of parity check monitors; and
    locating an approximate position of the cycle slip based on the values of the plurality of parity check monitors.

12. The method of claim 11 further comprising:
    locating a precise position of the cycle slip by testing a plurality of positions near the approximate position of the cycle slip by attempting to decode the user data and the parity data according to the LDPC matrix.

13. The method of claim 12 further comprising:
correcting the cycle slip.

14. A method of reading data from a storage medium, including cycle slip detection and correction, the method comprising:
- establishing a low density parity check code (LDPC) matrix for use in decoding data, the LDPC matrix including a first area for cycle slip detection and correction, the first area satisfying a set of conditions such that a cycle slip at a particular position creates a pattern of parity check errors indicative of the position and polarity of the cycle slip;
- reading user data and parity data from the storage medium, including decoding the user data and the parity data according to the LDPC matrix; and
- wherein decoding includes, upon detecting a pattern of parity check errors indicative of the position and polarity of a detected cycle slip, correcting the detected cycle slip.

15. The method of claim 14 wherein the storage medium is a high recording density magnetic tape.

16. The method of claim 14 wherein the first area satisfies a plurality of conditions, each condition relating to a corresponding sequence of neighboring columns of the LDPC matrix.

17. The method of claim 14 wherein the set of conditions defines a plurality of parity check monitors, and wherein decoding the user data and the parity data according to the LDPC matrix further comprises:
- calculating the values of the plurality of parity check monitors;
- detecting a cycle slip based on the values of the plurality of parity check monitors; and
- locating an approximate position of the cycle slip based on the values of the plurality of parity check monitors.

18. The method of claim 17 further comprising:
- locating a precise position of the cycle slip by testing a plurality of positions near the approximate position of the cycle slip by attempting to decode the user data and the parity data according to the LDPC matrix; and
- correcting the cycle slip.

19. A cycle slip detection and correction system for reading data from a storage medium, the system comprising:
- a storage hardware component configured to:
  - establish a low density parity check code (LDPC) matrix for use in decoding data, the LDPC matrix including a first area for cycle slip detection and correction, the first area satisfying a set of conditions such that a cycle slip at a particular position creates a pattern of parity check errors indicative of the position and polarity of the cycle slip;
  - read user data and parity data from the storage medium, including decoding the user data and the parity data according to the LDPC matrix; and
  - wherein decoding includes, upon detecting a pattern of parity check errors indicative of the position and polarity of a detected cycle slip, correcting the detected cycle slip.

20. The system of claim 19 wherein the set of conditions defines a plurality of parity check monitors, and wherein decoding the user data and the parity data according to the LDPC matrix further comprises:
- calculating the values of the plurality of parity check monitors;
- detecting a cycle slip based on the values of the plurality of parity check monitors; and
- correcting the cycle slip.

* * * * *